United States Patent
Zhou et al.

(10) Patent No.: US 10,504,931 B2
(45) Date of Patent: Dec. 10, 2019

(54) FAN-OUT LINE COMPONENT, DISPLAY DEVICE COMPRISING THE SAME, AND FAN-OUT LINE WIRING METHOD

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Yan Zhou, Beijing (CN); Dalong Mao, Beijing (CN); Yi Dan, Beijing (CN); Hailong Wu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/736,788

(22) PCT Filed: Mar. 17, 2017

(86) PCT No.: PCT/CN2017/077062
§ 371 (c)(1),
(2) Date: Dec. 15, 2017

(87) PCT Pub. No.: WO2018/036141
PCT Pub. Date: Mar. 1, 2018

(65) Prior Publication Data
US 2018/0358383 A1    Dec. 13, 2018

(30) Foreign Application Priority Data
Aug. 22, 2016  (CN) .......................... 2016 1 0697244

(51) Int. Cl.
*H01L 27/12*   (2006.01)
*H01L 23/49*   (2006.01)
(Continued)

(52) U.S. Cl.
CPC .......... *H01L 27/124* (2013.01); *H01L 21/768* (2013.01); *H01L 23/49* (2013.01); *H01L 23/528* (2013.01)

(58) Field of Classification Search
CPC .... H01L 21/768; H01L 23/528; H01L 27/124
See application file for complete search history.

(56) References Cited

U.S. PATENT DOCUMENTS 9,893,139 B2 * 2/2018 Kim ................... H01L 27/3279
2003/0227078 A1 * 12/2003 Chang .................. G02F 1/1345
257/693
(Continued)

FOREIGN PATENT DOCUMENTS

CN    101097322 A    1/2008
CN    101673003 A    3/2010
(Continued)

OTHER PUBLICATIONS

First Office Action for Chinese Patent Application No. 201610697244.9 dated Apr. 4, 2018.
(Continued)

*Primary Examiner* — Allan R Wilson
(74) *Attorney, Agent, or Firm* — Calfee, Halter & Griswold LLP

(57) ABSTRACT

A fan-out line component, a display device comprising the same, and a fan-out line wiring method are disclosed. The fan-out line component is used for signal connection between a first functional region and a second functional region. A channel in an intermediate section of a channel wire outlet end of the first functional region is a dummy
(Continued)

channel. A first wiring from an effective signal channel in the first functional region which is closest to the dummy channel to the second functional region extends to a central normal region of the dummy channel, and then extends in the central normal region along a direction of a central normal.

8 Claims, 3 Drawing Sheets

(51) Int. Cl.
*H01L 21/768* (2006.01)
*H01L 23/528* (2006.01)

(56) References Cited

U.S. PATENT DOCUMENTS

| | | |
|---|---|---|
| 2007/0296659 A1 | 12/2007 | Kwak et al. |
| 2013/0141877 A1* | 6/2013 | Lau ................. H01L 23/528 361/748 |
| 2014/0098495 A1 | 4/2014 | Jeon |
| 2014/0332898 A1 | 11/2014 | Du |
| 2014/0374140 A1* | 12/2014 | Chai ................. H01L 27/124 174/250 |
| 2016/0181349 A1* | 6/2016 | Cho ................. H01L 27/3223 257/40 |
| 2016/0255719 A1 | 9/2016 | Song et al. |
| 2016/0365062 A1* | 12/2016 | Wu ................. G09G 5/003 |
| 2017/0219856 A1* | 8/2017 | Fu ................. G01R 31/2825 |
| 2017/0257957 A1 | 9/2017 | Xu et al. |
| 2017/0288008 A1* | 10/2017 | Kim ................. H01L 27/3279 |
| 2017/0358603 A1* | 12/2017 | Choi ................. G09G 3/3258 |
| 2018/0068940 A1* | 3/2018 | Oh ................. H01L 25/18 |

FOREIGN PATENT DOCUMENTS

| | | |
|---|---|---|
| CN | 104134406 A | 11/2014 |
| CN | 105188259 A | 12/2015 |
| CN | 105204248 A | 12/2015 |
| CN | 106169456 A | 11/2016 |

OTHER PUBLICATIONS

Search Report for International Application No. PCT/CN2017/077062 dated Jun. 22, 2017.

* cited by examiner

FAN-OUT LINE COMPONENT, DISPLAY DEVICE COMPRISING THE SAME, AND FAN-OUT LINE WIRING METHOD

RELATED APPLICATIONS

The present application is the U.S. national phase entry of PCT/CN2017/077062, with an international filing date of Mar. 17, 2017, which claims the benefit of Chinese Patent Application 201610697244.9, filed on Aug. 22, 2016, the entire disclosures of which are incorporated herein by reference.

TECHNICAL FIELD

This disclosure relates to the field of display technique, and particularly to a fan-out line component, a display device comprising the same, and a fan-out line wiring method.

BACKGROUND

Fan-out wiring is a key issue in a design of circuit boards and particularly in a design of TFT-LCD panel. Difference in electrical resistance among lines of the fan-out lines may cause inconsistent signal delay, which easily incurs a split screen or vertical and horizontal blocks. When a number of channels at an IC end differs from that of channels at a display area, i.e., when the number of channels at the display area is smaller than that of the used IC, the channels at both outer sides of IC are usually used (i.e., redundant channels at the intermediate section are dummy), so that there is more sufficient space for wiring in a horizontal direction. However, in the related art wiring method, usually there is large spare space above the dummy channels of a wire outlet end of IC. This increases the wiring space, and difference in electrical resistance among lines is relatively large, which easily causes the phenomenon of split screen.

SUMMARY

In view of the above problems, the present disclosure provides an improved fan-out line component, a display device comprising the same, and a fan-out line wiring method.

In one aspect, it is provided a fan-out line component for signal connection between a first functional region and a second functional region, wherein a channel in an intermediate section of a channel wire outlet end of the first functional region is a dummy channel, and wherein a first wiring from an effective signal channel in the first functional region which is closest to the dummy channel to the second functional region extends to a central normal region of the dummy channel, and then extends in the central normal region along a direction of a central normal.

In a further embodiment, wirings other than the first wiring which are configured to connect other channels are arranged according to the shape of a neighboring wiring which is closer to the dummy channel, under the condition that the smallest line spacing is met.

In a further exemplary embodiment, the first wiring comprises a first functional region joining segment, a space utilization segment, and a central normal segment which are connected in this order, and the space utilization segment extends from the wire outlet end of the first functional region to the central normal of the dummy channel in an inclined manner.

In an exemplary embodiment, the space utilization segment extends to the central normal of the first functional region at a predefined angle with respect to an edge of the first functional region.

In an exemplary embodiment, said other wirings comprise the first functional region joining segment, the space utilization segment, the central normal segment, and a space compression segment which are connected in this order, and the space compression segment is inclined in a direction away from the direction of the central normal.

In an exemplary embodiment, as said other wirings are further from the central normal of the first functional region, an extending length of the central normal segment and the space utilization segment of said other wirings becomes smaller.

In an exemplary embodiment, the central normal segment and the central normal segment are arranged in a shape of Chinese character "弓" or "之".

In an exemplary embodiment, the first wiring further comprises a second functional region joining segment which is connected to the central normal segment.

In an exemplary embodiment, said other wirings further comprise a second functional region joining segment which is connected to the central normal segment.

In an exemplary embodiment, the first functional region is an integrated circuit, and the second functional region is a display panel.

In second aspect, it is provided a display device, comprising an integrated circuit, a display panel, and the fan-out line components as described above.

In third aspect, it is provided a method for wiring fan-out lines between a first functional region and a second functional region, wherein a channel in an intermediate section of a channel wire outlet end of the first functional region is a dummy channel. The method comprises:

arranging a first wiring from an effective signal channel in the first functional region which is closest to the dummy channel to the second functional region to extend to a central normal region of the first functional region, and then extend in the central normal region along a direction of a central normal; and arranging wirings other than the first wiring which are configured to connect other channels according to the shape of a neighboring wiring which is closer to the dummy channel, under the condition that the smallest line spacing is met.

BRIEF DESCRIPTION OF THE DRAWINGS

The accompanying drawings are provided for further understanding of embodiments and the accompanying drawings are incorporated to constitute a part of the present disclosure. The accompanying drawings illustrate embodiments and explain the principles of the present disclosure together with the brief description. It could be easily realized that other embodiments and many desired advantages of embodiments, which could become easy to be understood by reference of description in details below. The elements in the accompanying drawing are not necessarily to scale. The same reference signals represent corresponding similar elements.

DETAILED DESCRIPTION OF EMBODIMENTS

Detailed description will be presented hereinafter with reference to the accompanying figures which constitute a part of the detailed description, and will be illustrated by exemplary embodiments in which the present disclosure can be practiced.

Figure 1:
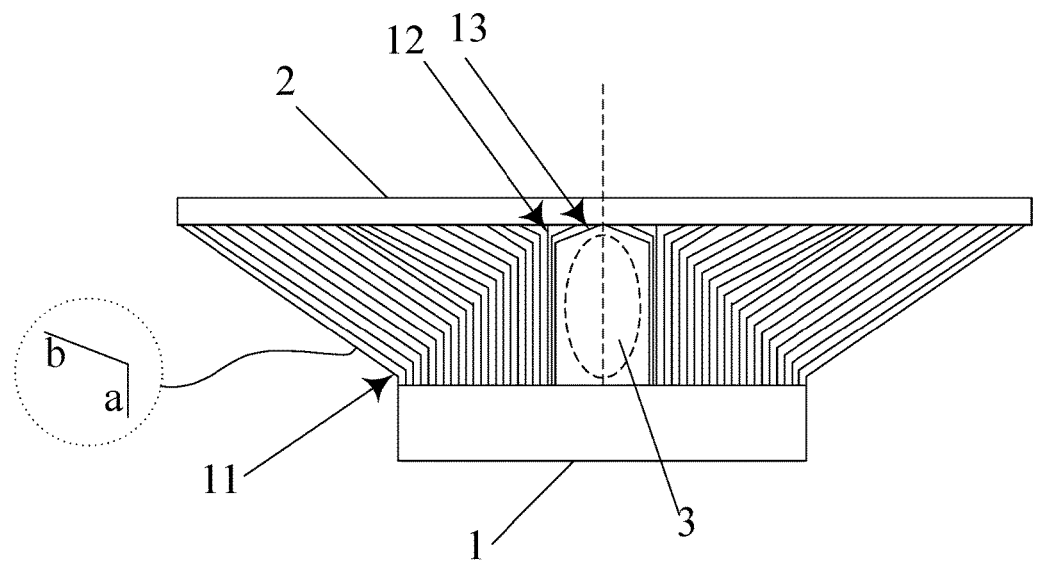
FIG. 1 illustrates a fan-out line component in the related art.

FIG. 1 illustrates a layout of fan-out lines for connecting an IC end 1 and a display end 2 in the related art. As shown in FIG. 1, a channel in an intermediate section of a wire outlet end at the IC end 1 is suspended and thus forms a dummy section. Taking the wiring requirement of 15.6 FHD as an example, the number of all channels at the IC end 1 is 1200, while the number of the actually used channels is 960. Thus, 240 channels at a center of the IC are actually dummy, and a dummy section forms above these channels.

In view of the foregoing, in a traditional wiring method, the wiring form of a channel 11 at the outermost section of the IC is taken as a baseline. This channel 11 has a basic line comprising two parts, i.e., an "a" part for connecting the IC and a "b" part for compressing space. This basic line is particularly illustrated in a dashed block on the left side of FIG. 1. On the premise that connectivity is ensured, the lines are arranged in this order towards the center (up to a channel 12) according to a predefined standard of the smallest line width and spacing. At the channel 12, there is no "b" part in the connection line, and generally the connection line of the channel 12 has the smallest line resistance. Again, the connection lines at the right side of the channel 12 (e.g., as shown by the connection line 13) have an "a" part for connecting the IC and a "b" part for compressing the space. However, this wiring form of fan-out lines will form relatively large spare space 3 above the dummy channel of the wire outlet end of the IC, which increases the wiring space.

Figure 2:
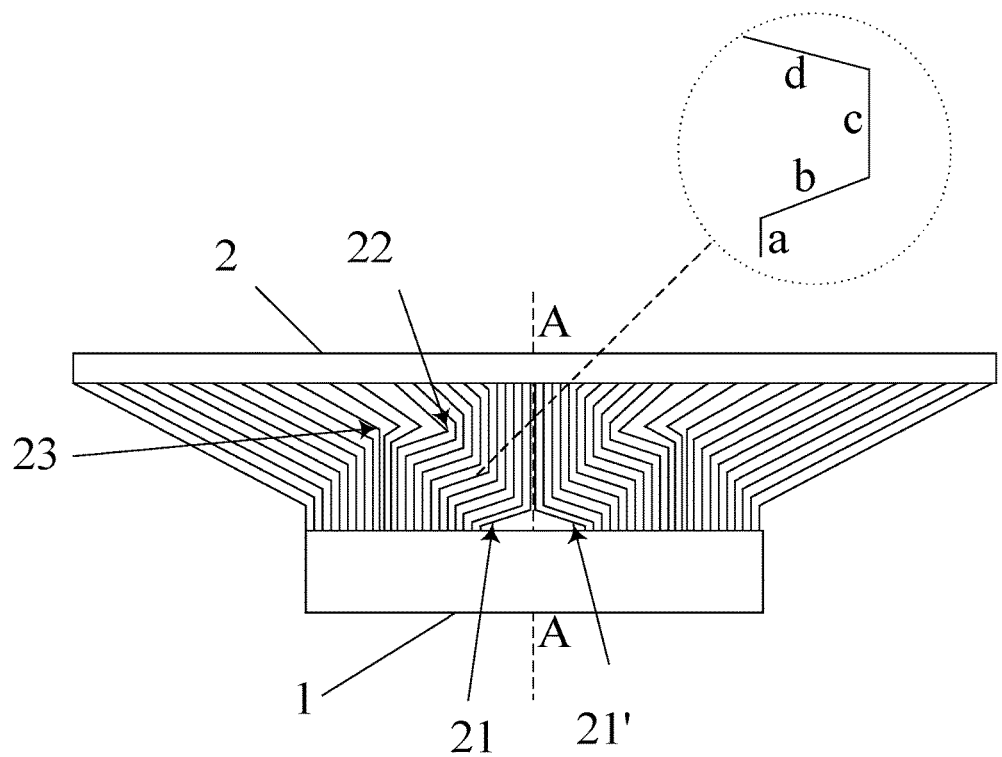
FIG. 2 illustrates a fan-out line component according to an embodiment of the present disclosure.

FIG. 2 illustrates a fan-out line component according to an embodiment of the present disclosure. The fan-out line component is for example used to provide signal connection between a first functional region 1 and a second functional region 2. The first functional region is for example an integrated circuit (IC) and the second functional region is for example a display panel. In the following, by taking the IC and the display panels as examples, the fundamental principle of the fan-out line component of the present disclosure is explained.

In the figure, the channel in the intermediate section of the channel wire outlet end of the IC 1 is a dummy channel. The dashed line A-A represents the central normal of the dummy channel section. As shown by the line 21 in FIG. 2, the first wiring from an effective signal channel which is closest to the dummy channel of the IC 1 to the display panel 2 substantially extends to a position where the central normal position of the IC 1 is located, and then extends along a direction of the central normal. In order to not waste the space above the dummy channels (i.e., the space which is located between the IC 1 and the display panel 2 and is closer to the display panel 2 in the direction of the central normal), after extending from the IC, the connection line 21 (or referred to as the first wiring) extends to the central normal in an inclined manner. After reaching the central normal or its vicinity, the connection line 21 then extends to the display panel 2 along the direction of the central normal.

As far as the line type is concerned, the connection line 21 comprises a first functional region (i.e., the IC) joining segment (i.e., a segment which extends from a pin or a wire outlet end of the IC), a space utilization segment (i.e., an oblique segment which extends or inclines towards the central normal), and a central normal segment (i.e., a segment which extends along the direction of the central normal), which are connected in this order. In case the first wiring is directly connected to the wire outlet end of the display panel at the central normal segment, the first wiring generally yields smaller resistance than the remaining wirings. The inclined angle of the space utilization segment of the connection line 21 is adjustable according to the actual requirements, which at least determines a final length and electrical resistance of the connection line 21.

Moreover, as shown in FIG. 2, on the other side of the dummy channel section (i.e., the right side in the figure), the effective signal channel which is closest to the dummy channel (as shown by the connection line 21') has a form similar with the connection line 21.

As also shown in FIG. 2, wirings other than the first wiring which are configured to connect other channels are arranged according to the shape of a neighboring wiring which is closer to the dummy channel, under the condition that the smallest line spacing is met. The smallest line spacing is a distance between two neighboring wirings which is safe to guarantee that a short circuit does not occur between these two neighboring wirings due to manufacturing process, and to prevent the possible crosstalk between these two wirings. The smallest line spacing is generally 10 mils, or less than 10 mils. It should be noted that for purpose of making full use of the wiring space, during arrangement of other wirings, it is required that these wirings have a same shape as the connection lines of the wiring which has been arranged previously. In these other wirings, similarly, a segment corresponding to the central normal section is referred to as a segment parallel to the central normal region (i.e., a segment which substantially extends in a same direction as the extending direction of the central normal, but is spaced apart from the central normal). It will be readily appreciated by a person with ordinary skill in the art that as these other wirings are further from the central normal, an extending length of the segment parallel to the central normal region and the space utilization segment will decrease gradually up to a value of zero. This is clearly shown at the connection line 22 and the connection line 23 in FIG. 2.

In a dashed block at the top-right corner of FIG. 2, a basic line type of the fan-out line in embodiments of the present disclosure is shown. The basic line type comprises a first functional region joining segment a, a space utilization segment b, a central normal segment or a segment parallel to the central normal c, and a space compression segment d, which are connected in this order. The space compression segment d is inclined in a direction away from the direction of the central normal, and thus in a direction opposite to the inclined direction of the space utilization segment. The further the space compression segment d is away from the central normal, the longer the space compression segment d is. It can be seen that, as compared with the basic line type of the related art fan-out line in FIG. 1, the basic line type in embodiments of the present disclosure may further comprise the space utilization segment b and the central normal segment or the segment parallel to the central normal c.

Therefore, the fan-out line component according to embodiments of the present disclosure makes full use of the spare spaces above the dummy channel, so that the wiring space required by the fan-out lines is further reduced. Moreover, according to the wring principle of the fan-out lines, the connection lines closer to the intermediate section of the wire outlet end of the IC or display panel are generally shorter, and thus have smaller resistance. In the fan-out line component according to embodiments of the present disclosure, the space utilization segment b and the segment parallel to the central normal c are increased, so that difference in electrical resistance among fan-out lines is reduced. This may realize more stable and reliable signal transmission.

Figure 3:
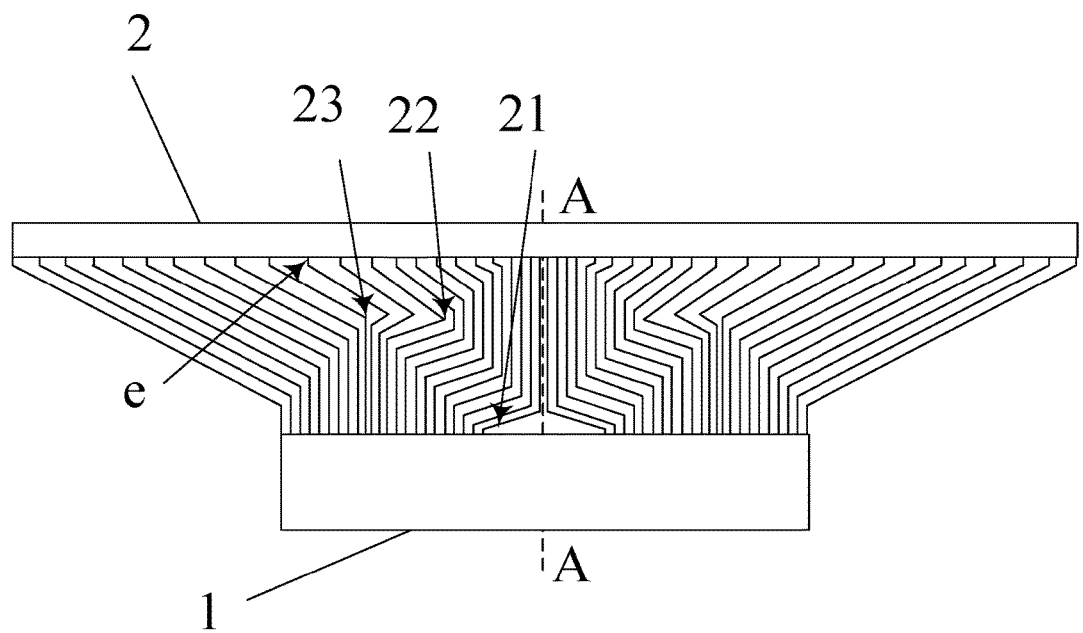
FIG. 3 illustrates a fan-out line component according to another embodiment of the present disclosure.

FIG. 3 illustrates a fan-out line component according to another embodiment of the present disclosure. In this embodiment, each connection line in the fan-out line component further comprises a second functional region (i.e., the display panel) joining segment e which is connected to the space compression segment. Apart from this, the fan-out line component is similar with that of FIG. 2. Such a fan-out line component enables an improved connection of the connection lines to the display panel.

Figure 4:
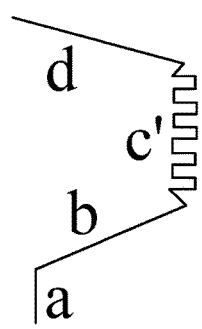
FIG. 4 is a schematic diagram for illustrating the basic line shapes of fan-out lines according to a further embodiment of the present disclosure.

In yet another embodiment, the central normal segment or the segment parallel to the central normal in the fan-out line can be arranged in a shape of Chinese character "弓" or "之" as desired, instead of the shape of straight line, as shown by c' in FIG. 4. In this way, the electrical resistance of the connection lines close to the intermediate section is further increased and thus difference in electrical resistance among the connection lines is further reduced.

The fan-out line component as described above may be beneficially applied to a display device. The wiring space needed is reduced. The difference in delay of signal transmission of the display device is reduced, and the probability of phenomena like a split screen in the display device is reduced.

Figure 5:
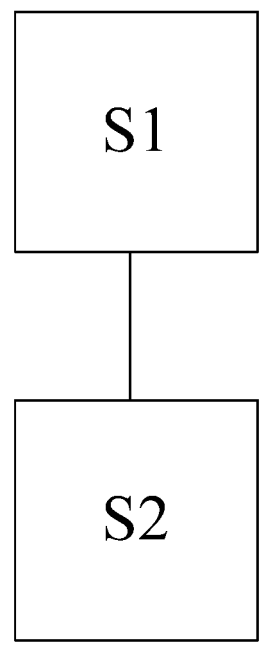
FIG. 5 illustrates a fan-out line wiring method according to an embodiment of the present disclosure.

FIG. 5 illustrates a fan-out line wiring method according to embodiments of the present disclosure. The method is applicable to a case in which a channel in the intermediate section of a channel wire outlet end of the first functional region is a dummy channel. The method comprises the following steps.

In a first step S1, a first wiring from an effective signal channel in the first functional region which is closest to the dummy channel to the second functional region is arranged to extend to a central normal region of the first functional region (i.e., generally extend to the central normal), and then extend in the central normal region along the direction of the central normal.

In a second step S2, wirings other than the first wiring which are configured to connect other channels are arranged according to the shape of a neighboring wiring which is closer to the dummy channel, under the condition that the smallest line spacing is met. For example, the second wiring adjacent to the first wring is arranged according to the shape of the first wring under the condition of the smallest line spacing, and the third wiring adjacent to the second wring is arranged according to the shape of the second wring under the condition of the smallest line spacing, and so forth.

By arranging the wirings in this manner, the fan-out line component as described above may be achieved. The fan-out line component may reduce the difference in delay of signal transmission of the display device and reduce the probability of phenomena like a split screen in the display device.

By use of the fan-out line component in embodiments of the present disclosure, the free region above the dummy channels are fully used and thus the wiring space for fan-out lines is reduced. In addition, difference in electrical resistance among the fan-out lines is reduced and thus the difference in delay of signal transmissions is reduced. This achieves more stable and reliable signal transmission. The display effect in a display device is improved when the fan-out line component is applied to the display device.

What have been described above are particular implementations of the present disclosure, while the protection scope of the present disclosure is not limited to this. Any variation or alternation which can be easily thought by the person with ordinary skill in the art falls within the scope of the present disclosure. Therefore, the protection scope of the present disclosure is defined by the appended claims.

In the description of the present disclosure, it is noted that the orientations or positional relationships indicated by the terms "upper", "lower", "inner", "outer", etc. are only orientations or positional relationships based on the accompanying figures, which are only used for describing the present disclosure and simplifying the description, rather than indicating or suggesting that the device or elements must be in specific orientations or constitute and operate in specific orientations. Thus they should not be construed as limiting the scope. The word "comprising" does not exclude other elements or steps not listing in the claims, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

What is claimed is:

1. A fan-out line component for signal connection between a first functional region and a second functional region,
   wherein a channel in an intermediate section of a channel wire outlet end of the first functional region is a dummy channel,
   wherein a first wiring from an effective signal channel in the first functional region which is closest to the dummy channel to the second functional region extends to a central normal region of the dummy channel, and then extends in the central normal region along a direction of a central normal,
   wherein wirings other than the first wiring which are configured to connect other channels are arranged according to the shape of a neighboring wiring which is closer to the dummy channel, under the condition that the smallest line spacing is met,
   wherein the first wiring comprises a first functional region joining segment, a space utilization segment, and a central normal segment which are connected in this order, and the space utilization segment extends from the wire outlet end of the first functional region to the central normal of the dummy channel inclined to an edge of the first functional region,
   wherein said other wirings comprise the first functional region joining segment, the space utilization segment, the central normal segment, and a space compression segment which are connected in this order, and the space compression segment is inclined in a direction away from the direction of the central normal, and
   wherein as said other wirings are further from the central normal of the first functional region, an extending length of the central normal segment and the space utilization segment of said other wirings becomes smaller.

2. The fan-out line component of claim 1, wherein the space utilization segment extends to the central normal of the first functional region at a predefined angle with respect to an edge of the first functional region.

3. The fan-out line component of claim 1, wherein the central normal segment and the central normal segment are arranged in a shape of Chinese character "弓" or "之".

4. The fan-out line component of claim 1, wherein the first wiring further comprises a second functional region joining segment which is connected to the central normal segment.

5. The fan-out line component of claim 1, wherein said other wirings further comprise a second functional region joining segment which is connected to the central normal segment.

6. The fan-out line component of claim 1, wherein the first functional region is an integrated circuit, and the second functional region is a display panel.

7. A display device, comprising an integrated circuit, a display panel, and the fan-out line component of claim 6.

8. A method for wiring fan-out lines between a first functional region and a second functional region, wherein a channel in an intermediate section of a channel wire outlet end of the first functional region is a dummy channel, and the method comprises:

arranging a first wiring from an effective signal channel in the first functional region which is closest to the dummy channel to the second functional region to extend to a central normal region of the first functional region, and then extend in the central normal region along a direction of a central normal;

arranging wirings other than the first wiring which are configured to connect other channels according to the shape of a neighboring wiring which is closer to the dummy channel, under the condition that the smallest line spacing is met, wherein the first wiring comprises a first functional region joining segment, a space utilization segment, and a central normal segment which are connected in this order, and the space utilization segment extends from the wire outlet end of the first functional region to the central normal of the dummy channel inclined to an edge of the first functional region, wherein said other wirings comprise the first functional region joining segment, the space utilization segment, the central normal segment, and a space compression segment which are connected in this order, and the space compression segment is inclined in a direction away from the direction of the central normal, and wherein as said other wirings are further from the central normal of the first functional region, an extending length of the central normal segment and the space utilization segment of said other wirings becomes smaller.

* * * * *